US006699797B1

United States Patent
Morris et al.

(10) Patent No.: US 6,699,797 B1
(45) Date of Patent: Mar. 2, 2004

(54) METHOD OF FABRICATION OF LOW DIELECTRIC CONSTANT POROUS METAL SILICATE FILMS

(75) Inventors: Michael A. Morris, Cork (GB); Kevin M. Ryan, Cork (GB); Justin D. Holmes, Cork (GB); Willie J. Lawton, Celbridge (IE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/323,988

(22) Filed: Dec. 17, 2002

(51) Int. Cl.[7] .................. H01L 21/31; H01L 21/469
(52) U.S. Cl. .............. 438/778; 438/785; 427/397.7; 423/326; 423/327.1
(58) Field of Search ................ 438/778, 785; 427/397.7; 423/326, 327.1

(56) References Cited

U.S. PATENT DOCUMENTS

| | | | |
|---|---|---|---|
| 5,057,296 A | | 10/1991 | Beck |
| 5,098,684 A | | 3/1992 | Kresge et al. |
| 5,215,737 A | | 6/1993 | Chu et al. |
| 5,858,457 A | | 1/1999 | Brinker et al. |
| 6,063,714 A | * | 5/2000 | Smith et al. ............ 438/778 |
| 6,204,202 B1 | | 3/2001 | Leung et al. |
| 6,558,755 B2 | * | 5/2003 | Berry, III et al. .......... 427/489 |
| 6,576,300 B1 | * | 6/2003 | Berry, III et al. .......... 427/489 |
| 2003/0119335 A1 | * | 6/2003 | Wallace et al. ........... 438/778 |

FOREIGN PATENT DOCUMENTS

| | | |
|---|---|---|
| EP | 0997497 A1 | 7/1998 |
| JP | 7213877 | 8/1995 |
| WO | WO 99/37705 | 7/1999 |
| WO | WO 00/000244050 | 4/2000 |
| WO | WO 00/39028 | 7/2000 |

OTHER PUBLICATIONS

Pozarnsky et al, Multinuclear NMR study of aluminosilicate sol gel, J of Nonncrystalline solids 1995.*
M. McCoy, "Silicon Chips May be Viable a While Longer", Chemical and Engineering News, Science/Technology Concentrates, Apr. 24, 2000, vol. 78, No. 17.
W.D.Callister, Jr., "Materials Science and Engineering–An Introduction–Capacitance", 5th Edition J. Wiley and Sons, New York, 2000, pp. 639–640.
C.J. Brinker et al., "Sol–Gel Science: The Physics and Chemistry of Sol–Gel Processing", Academic Press.
R.L. Virta, "Zoelites".
U.Ciesla et al. Ordered Mesoporous Materials . Microporous and Mesoporous Materials, 27 (1999), pp. 131–149.
T.R. Pauly et al., "Textural Mesoporosity and the Catalytic Activity of Mesoporous Molecular Sieves with Wormhole Framework Structures", J. American Chemical Society, 1999, 38(1999) 8835–8842.
S. Obrien et al. "The Formation of the Gel Precursors to Mesoporous Silicon Oxides: Fast Synthetic Routes and Doping in these Materials", Supported Reagents and Catalyst in Chemistry, 97(1998), pp. 168–173.
P.T. Tanev et al., "A Neutral Templating Route to Mesoporous Molecular Sieves", Science, vol. 267(1995), pp. 865–867.

(List continued on next page.)

*Primary Examiner*—Alexander Ghyka
(74) *Attorney, Agent, or Firm*—Cyndi M. Wheeler

(57) ABSTRACT

The present provides a method for forming a porous metal silicate dielectric layer having a dielectric constant of less than 2.0. The porous metal silicate dielectric formed by embodiments of the present invention is suitable for integration into the microelectronic device manufacturing process. By carefully controlling the amount and type of surfactant used, the pore size and structure of the dielectric layer can be predetermined.

35 Claims, 4 Drawing Sheets

OTHER PUBLICATIONS

S.A. Bagshaw et al., "Templating of Mesoporous Molecular Sieves by Nonionic Polyethylene Oxide Surfactants", Science, vol. 269, Sep. 1995, pp. 1242–1244.

D. Zhoa et al., "Triblock Copolymer Syntheses of Mesoporous Silica with Periodic 50 to 300 Angstrom Pores", Science, vol. 279, Jan. 1998, pp. 548–552.

Y. Cesteros et al., "Several Factors Affecting AI–MCM–41 Synthesis", Microporous and Mesoporous Materials, vol. 43 (2001), pp. 171–173.

G.A. Pozarnsky et al., "Multinuclear NMR Study of Aluminosilicate Sol–Gel Synthesis Using the Prehydrolysis Method", Journal of Non–Crystalline Solids 190 (1995) 212–225.

J. Parmentier et al., "Influence of Transition Metal Oxides on Sol–Gel Mullite Crystallization", Journal of Alloys and Compounds, 264 (1998) 136–141.

J. Yu et al., "Room Temperature Synthesis of Mesoporous Aluminosilicate Materials", Ceramics International 26 (2000) 359–362.

R.C. Hayward et al., "The Current Role of Mesostructures in Composite Materials and Device Fabrication" Microporous and Mesoporous Materials, 44–45 (2001) 619–624.

S.C. Tsang et al, "Nanoscopic Tin Oxide Films on Mesoporous Silica as Novel Catalysts for Hydrogen Transfer Reactions", Nanostructured Materials, vol. 12, Issues 5–8, 1999.

Dielectric Constants Reference Guide, www.us.milltronics.com/dc.htm.

D. Zhoa et al. Continuous Mesoporous Silica Films with Highly Ordered Large Pore Structures, Adv. Mater. 1998, 10, No. 16, pp. 1380–1385.

B.E. Yoldas, :Modification of Polymer–Gel Structures, Journal of Non–Crystalline Solids 63, 1984), North–Holland, Amsterdam, pp. 145–154.

L.W. Kelts et al., "Molecular Building Blocks in Low PH Silicon Sol–Gels: A Silicon–29 NMR Study ", Mat. Res. Soc. Symp. Proc .vol 121, 1988, Materials Research Society, pp. 519–522.

* cited by examiner

METHOD OF FABRICATION OF LOW DIELECTRIC CONSTANT POROUS METAL SILICATE FILMS

BACKGROUND OF THE INVENTION

1. Field of the Invention

The present invention relates generally to semiconductor manufacturing and more particularly the invention relates to the preparation of a porous metal silicate film having a low dielectric constant.

2. Background

Silica films, such as $SiO_2$, are used in the microelectronics industry as dielectrics. A dielectric is described by its dielectric constant, more commonly known as the k-value of the dielectric. Dielectrics are used to isolate metal lines or layers from one another. Using a dielectric with a low dielectric constant helps to lessen crosstalk, the undesired capacitive or inductive interaction of one part of the circuit to another. As device density on integrated circuits increases, the metal lines become smaller, and the distance between metal layers decreases. As device geometries decrease, crosstalk effects become significant. Crosstalk effects can be reduced by lowering the k-value of the dielectric. Current technology uses dielectrics with a k-value between 2.5 and 4.0.

Silica has a dielectric constant of about 4.0, which is too high to be useful for next generation integrated circuits. Since air has a dielectric constant of 1.0, one way to lower the dielectric constant of silica is to incorporate voids or pores into the silica. There are several drawbacks to using this approach in an integrated circuit manufacturing process. First, porous dielectrics are generally not mechanically stable enough to support subsequent polishing operations. Additionally, the porous dielectric may allow transport of metal through the dielectric layer, or may contain organic materials that would cause electrical breakdown at high frequencies.

DETAILED DESCRIPTION

Terminology

Figure 1:
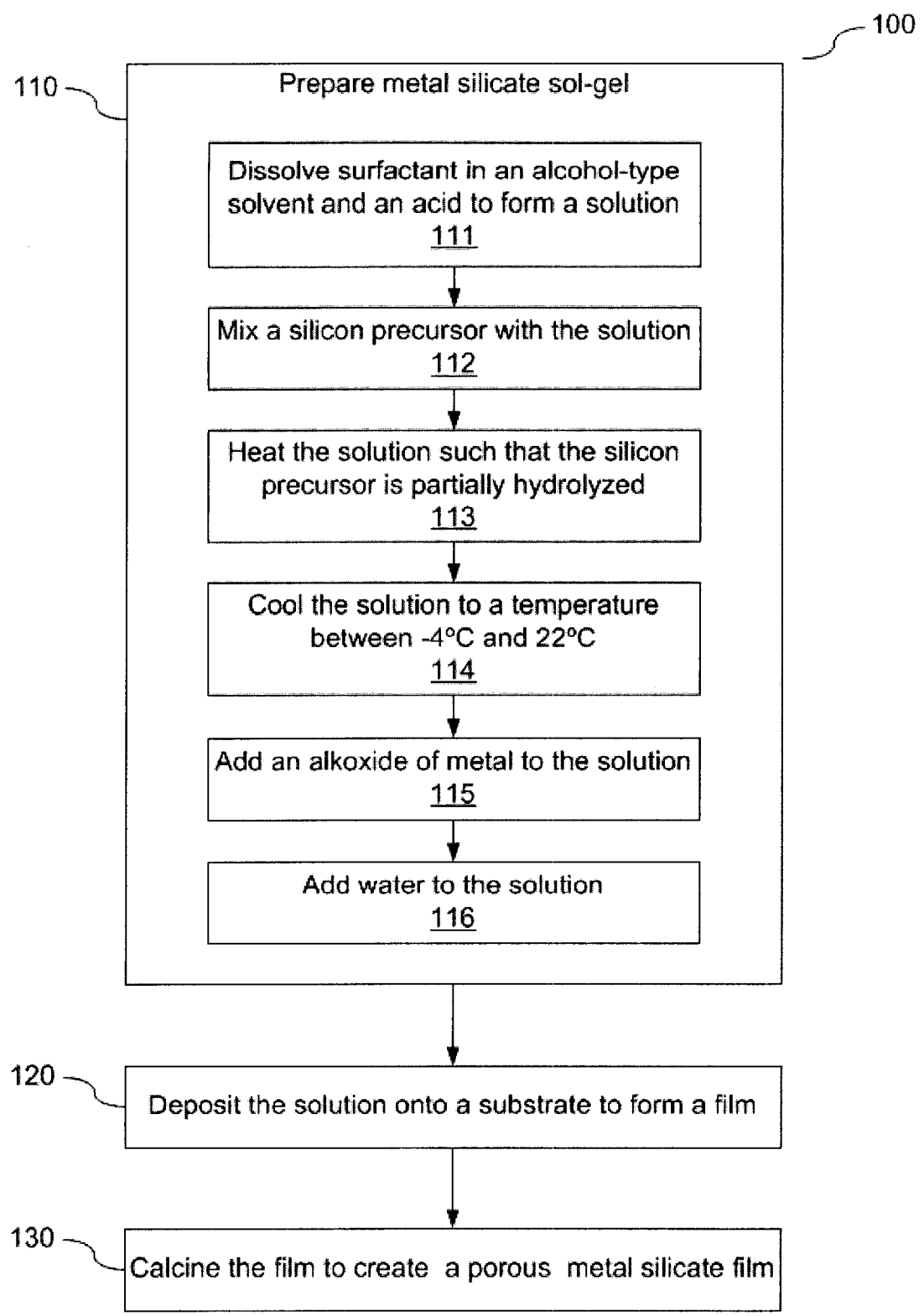
FIG. 1 is a flow diagram illustrating a process in accordance with the present invention.

The terms chip, integrated circuit, monolithic device, semiconductor device, and microelectronic device, are often used interchangeably in this field. The present invention is applicable to all of the above as they are generally understood in the field.

The terms contact and via both refer to structures for electrical connection of conductors from different interconnect levels. These terms are sometimes used in the art to describe both an opening in an insulator in which the structure will be completed, and the completed structure itself. For purposes of this disclosure, contact and via refer to the completed structure.

The expression low dielectric constant material refers to materials having a lower dielectric constant than silicon dioxide, which has a dielectric constant of 4. For example, organic polymers, amorphous fluorinated carbons, nanofoams, silicon based insulators containing organic polymers, carbon doped oxides of silicon and fluorine doped oxides of silicon have lower dielectric constants than silicon dioxide.

The letter k is often used to refer to dielectric constant. Similarly, the terms high-k and low-k are used in this field to refer to high dielectric constant and low dielectric constant respectively, where high means greater than the dielectric constant of silicon dioxide, and low means lower than the dielectric constant of silicon dioxide.

The parasitic capacitance seen by an interconnect line is a function of the distance to another conductor and the dielectric constant of the material between the conductors. However, increasing the spacing between interconnect lines increases the physical size, and thus the cost, of an integrated circuit. Therefore, in order to manufacture integrated circuits with low parasitic capacitance between interconnect lines, it is desirable to electrically isolate the conductors from each other with an insulator having a low dielectric constant.

One way to reduce the adverse effects of parasitic capacitance is to use low-k materials as insulators in advanced microelectronics. To achieve low dielectric constants, one can introduce porosity into the dielectric film. By increasing the film void fraction, or porosity, the thermal and mechanical properties of the film may be degraded. Illustrative embodiments of the present invention include a process for forming a porous metal silicate low-k dielectric material having thermal and mechanical properties that are desirable for integration into the integrated circuit fabrication process.

Metal silicate films are prepared by addition of a silicon source (precursor) to a suitable solvent, then adding ethanol, a mixture of structural directing agents (surfactants), an acid hydrolysis catalyst, and a controlled amount of water. The mixture is heated, producing a prehydrolysed product, in which the silica source has been only partially hydrolysed. Partial hydrolysation of the silicon precursor prevents precipitation of metal in subsequent reactions. After partial hydrolysation, the mixture is cooled. Cooling the mixture terminates the silicon precursor reaction and allows the reaction of the metal alkoxide to take place more slowly, preventing precipitation of aluminum solids. Following prehydrolysis and cooling, a metal alkoxide, which is a hydrolysable and condensable compound of a metal, such as aluminum sec-butoxide (ALBUO) and additional water is added to form a clear gel. The clear gel can be used to coat a substrate. The surfactant is then removed by pyrolysis or ozone treatment to yield a porous metal silicate film. The resulting film has a metal, such as aluminum, incorporated directly into the pore wall, which increases the mechanical strength of the film, allowing subsequent process operations to be completed on the dielectric layer without compromising the film's structural integrity. Additionally, by careful control of the type and amount of surfactants used, the pore size and structure can be varied, allowing the dielectric constant to be tuned consistently to a value of less than 2.0. This also gives a homogeneous film, which is desirable for use in a microelectronic device.

FIG. 1 is a flow diagram, 100, showing a process in accordance with the present invention, illustrating a general method of forming a porous metal silicate film. First, a metal silicate sol-gel is prepared as set forth in block 110. The sol-gel is then deposited onto a substrate to form a film, as set forth in block 120. Finally, as set forth in block 130, the film is calcined to create a porous metal silicate film.

In one embodiment of the invention, the metal silicate sol gel is prepared by a method 110 as set forth in blocks 111–116. As set forth in block 111, a surfactant, or combination of surfactants, is dissolved in an alcohol-type solvent and an acid to form an acid-surfactant solution. The acid-surfactant solution is stirred rapidly or sonicated at room temperature until all of the surfactant dissolves.

An embodiment of the surfactant used can be, but is not limited to, one of the following: triblock copolymers of polyethylene (PEO), polypropylene (PPO), polyalkyloxide materials, triblock neutral surfactants having the general formula EoxPOyEOz (e.g. P127, P123, P65), and polyoxyethylene alkyl ethers (e.g. $C_xH_{2x+1}$—O—$(CH_2$—$CH_2O)_zH$).

An embodiment of the alcohol-type solvent used can be, but is not limited to, one of the following: ethanol, methanol, 1- or 2-propanol, and 1-butanol.

An embodiment of an acid used can be, but is not limited to, one of the following: hydrochloric (HCl), nitric, sulfuric, phosphoric, hydrofluoric (HF), acetic, and citric acids.

In one embodiment of the invention, between 0–10 g of surfactant is measured into a glass beaker. 10.5 g of ethanol and 2.5 mL of 0.12M HCl are added to the surfactant at room temperature.

Next, as set forth by block 112, a silicon precursor is mixed with the acid-surfactant solution. Surfactant templating occurs at this point, prior to partial condensation of the silicon precursor. Templating is the process by which a liquid crystal template is formed by arrangements of organic molecules, around which metal alkoxide hydrolysis and condensation occurs. The template is a three dimensional arrangement of micelles formed from the organic molecules. The template is formed by the organic molecules prior to partial condensation of the silicon precursor and prior to addition of the inorganic metal alkoxide, which allows better control over the resulting structure and the ability to control the pore size of the resulting dielectric film to within 0.2 nm.

An embodiment of a suitable silicon precursor can be, but is not limited to, one of the following: tetraethoxysilane (TEOS), tetramethoxysilane (TMOS), tetrapropoxysilane (TPOS), and tetrabutoxysilane (TBOS).

In one embodiment, 22.6 g of TEOS is added to the acid-surfactant solution.

Next, as set forth in block 113, the silicon precursor-surfactant solution is stirred rapidly, and heated such that the silicon precursor is partially hydrolysed. The solution is heated from room temperature to a temperature between 22° C. and 100° C., where it is held at temperature for up to 2 hours, while stirring rapidly the entire time. In one embodiment, the solution will be ideally heated to a temperature between 40° C. and 50° C. where it is held for 15 minutes. Heating the solution allows the silicon precursor to form partially hydrolysed products in a reasonably short time. At higher temperatures, hydrolysis and condensation would occur rapidly and would lead to precipitation of solids. At room temperature and below, it would take several hours to form a sufficiently hydrolysed product.

In one embodiment, the solution is heated at a rate of 1–2° C. per minute.

Next, as set forth in block 114, the partially hydrolysed solution is cooled to a temperature between −4° C. and 22° C. In one embodiment, the solution is optimally cooled to 0° C. Cooling the solution terminates the silicon precursor hydrolysis reaction.

Next, as set forth in block 115, a metal alkoxide is added to the cooled partially hydrolysed solution. One embodiment of a metal alkoxide is aluminum sec butoxide (ALBUO). Another embodiment of a metal alkoxide can be, but is not limited to, an alkoxide of boron, lanthanum, yttrium, titanium, or zirconium.

Embodiments of the amount of ALBUO used are given by Table 1.

TABLE 1

| Wt. Surfactant (g) | Wt. ALBUO (g) | Moles Al | Moles Si | % Al | % Si |
|---|---|---|---|---|---|
| 7.00 | 0.14 | 0.0006 | .01101 | 0.50 | 99.50 |
| 7.00 | 0.27 | 0.0011 | 0.1101 | 1.00 | 99.00 |
| 7.00 | 0.41 | 0.0017 | 0.1101 | 1.50 | 98.50 |
| 7.00 | 0.62 | 0.0025 | 0.1101 | 2.25 | 97.75 |
| 7.00 | 0.70 | 0.0028 | 0.1101 | 2.50 | 97.5 |
| 7.00 | 0.77 | 0.0031 | 0.1101 | 2.75 | 97.25 |
| 7.00 | 0.91 | 0.0037 | 0.1101 | 3.25 | 96.75 |
| 7.00 | 0.98 | 0.0040 | 0.1101 | 3.50 | 96.50 |
| 7.00 | 1.06 | 0.0043 | 0.1101 | 3.75 | 96.25 |
| 7.00 | 1.28 | 0.0052 | 0.1101 | 4.50 | 95.50 |

Cooling the solution prior to addition of the metal alkoxide serves to slow the reactivity of the metal alkoxide. At room temperature and above, the metal alkoxide is so reactive that the hydrolysis/condensation reaction would result in precipitation of solid metal oxyhydroxide particles.

Adding a metal alkoxide to the cooled solution allows the reaction of the metal and silicon materials to cross condensate via reactions such as:

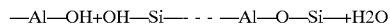

This means that the metal, for example, aluminum, is incorporated directly into the pore wall, which increases the mechanical strength and adhesion of the resulting porous metal silicate film.

The addition of a metal, such as aluminum, to the pore walls of the film has several other benefits as well. The aluminum increases the elasticity of the porous metal silicate film, resulting in high crack resistance. Porous dielectric films of silica only are more susceptible to cracking than a porous dielectric aluminosilicate film. Silica only films are four valent and contain terminal —OH groups, which makes them very reactive to the adsorption of $CO_2$ and water. The adsorbed species result in enhanced surface conductivity and increase the k value of the silica film. The addition of aluminum to the pore walls chemically passivates the dielectric film. Aluminum is trivalent and the same terminal —OH group is not present. This limits adsorption. For a molecule to react and form a chemical bond, the very strong Al—O—Al bond must be broken, therefore the resulting film is very unreactive. The use of aluminum allows aluminosilicate films to be exposed to a variety of process chemicals used in the polishing, etching, and cleaning processes of semiconductor manufacturing, such as, water, EtOH, tetramethylammoniumhydroxide, $H_2SO_4$, and $HNO_3$, without collapsing the pore structure. Additionally, the use of aluminum ensures the films are stable when exposed to air for long periods.

Next, as set forth in block 116, water is added to the solution and the mixture is stirred. If water is added prior to this stage, the metal will precipitate out as oxide or hydroxide and will not enter into the silicon reaction described above. The solution may also be filtered through a 0.25 μm filter before further film processing. The metal silicate sol-gel solution formed at this point will be clear and will contain no particulate matter.

After preparing the metal silicate sol-gel solution as set forth in block 110, the solution is deposited onto a substrate to form a film, as set forth in block 120. In one embodiment of the invention, the solution is deposited onto a substrate by dip coating. Typically, the substrate will include monocrystalline silicon substrate having active and passive devices, such as transistors and conductive interconnections, formed therein, but other substrates may be used.

Dip coating is normally done with an undiluted solution, where the substrates are immersed and withdrawn at 0.2 to 2 cm per minute. Optimally, the substrates are immersed and withdrawn at 0.5 cm/min. The solution can also be diluted with ethanol or another suitable solvent to control the thickness of the final film.

In another embodiment, the solution is deposited onto a substrate by spin coating the solution, which has been diluted with ethanol. Optimally, the solution is diluted to 50%, but may be diluted to other concentrations depending on the desired thickness of the final film. Ideally, the solution will be spin coated for 10 seconds at 100 rpm, then for 50 seconds at 5000 rpm, ramping the speed over 5 seconds, resulting in a transparent, evenly coated film with no visible cracks. In one embodiment, the resulting average film thickness will be 4.8 microns.

Next, the film is dried. The film may be dried in air at 40° C. to 80° C. for 8 to 24 hours. The drying process promotes condensation in the inorganics, and the material hardens to a glass-like film. Cracking will occur if drying is done too quickly.

After depositing the sol-gel solution onto a substrate, forming a film, as set forth in block 120, the sol-gel film can be calcined to remove the organic surfactant, thus forming a porous metal silicate film, as set forth in block 130.

In one embodiment, calcination occurs in an environment where the film is exposed to ozone.

In one embodiment of the present invention, calcination occurs in an oven or furnace sealed by compression gaskets. This allows only controlled gases into the calcining environment, thus minimizing the amount of air contamination.

The use of ozone in the calcination process allows for removal of all of the organic surfactant from the film by oxidation. If not all of the surfactant is removed, carbon may remain in the film after calcination, which can result in electrical breakdown at low and high frequencies. Optimally, the ozone has a concentration of 1 μg/mL and is fed through the oven at a rate of 31 mL/min. Nitrogen is also co-fed through the oven with the ozone at a rate of 31 mL/min. In one embodiment, the oven is ramped to a temperature of 400° C., and held for 4 hours. The oven is then cooled to room temperature. The resulting product is a clear and crack free porous metal silicate dielectric layer with a dielectric constant of less than 2.0.

Figure 2:
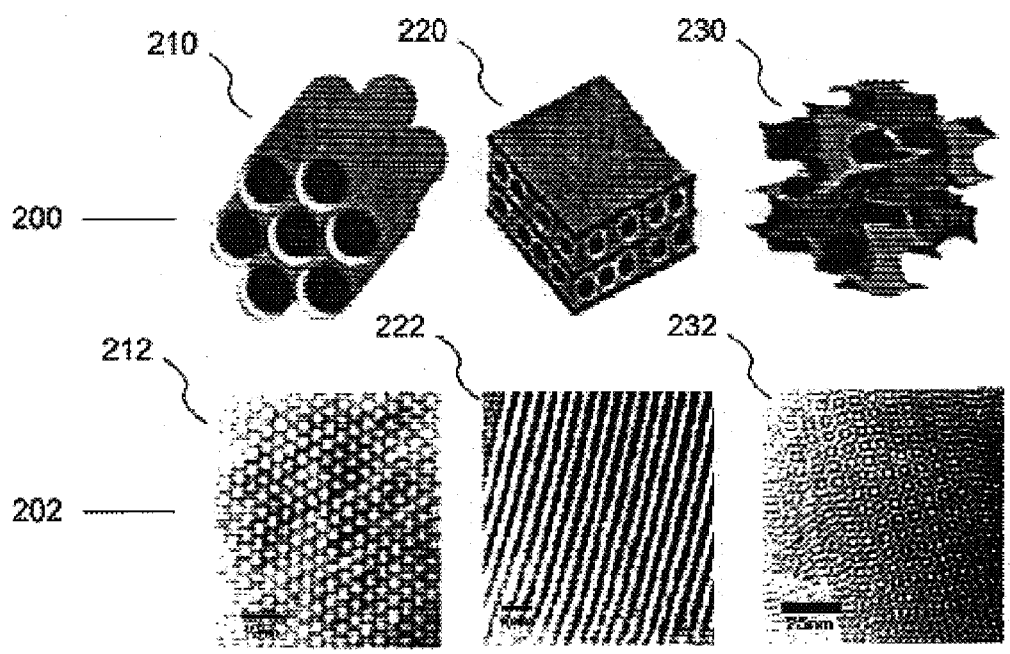
FIG. 2 shows images of porous material structures and their corresponding transmission electron micrographs.

FIG. 2 shows images of porous material structures 200 and their corresponding transmission electron micrographs 202. By controlling the surfactant concentration used in the preparation of the metal silicate sol-gel 110, the resulting pore structure of the film can be predetermined. Hexagonal 210, 212 and lamellar 220, 222 structures are desired because they are closed systems that do not allow transport of materials through the surface of the film. Cubic structures 230, 232 have channels running through the entire film that allow transport to and from the surface. This is an undesirable characteristic for a porous dielectric layer in a microelectronic device.

Embodiments of the amount and type of surfactant used in the preparation of the metal silicate sol-gel 110 and the resulting pore structures formed are given in Table 2.

TABLE 2

| Surfactant | Ordering | | | | | |
|---|---|---|---|---|---|---|
| | 2 g | 3 g | 4 g | 5 g | 6 g | 7 g |
| L121 EO5PO70EO5 | Mix | Mix | Lam | Lam | Lam | Mix |
| P65 EO20PO30EO20 | Mix | Mix | Lam | Hex | Hex | Hex |
| P85 EO26PO39EO26 | Lam | Lam | Hex | Hex | Hex | Hex |
| P123 EO20PO70EO20 | Mix | Lam | Hex | Hex | Hex | Mix |
| 25R4 EO19PO33EO19 | Lam | Hex | Hex | Hex | Mix | Mix |
| F88 EO102PO40EO102 | Mix | Mix | Lam | Hex | Hex | Cub |
| F127 EO106PO70EO106 | Mix | Mix | Lam | Hex | Hex | Cub |

Figure 3:
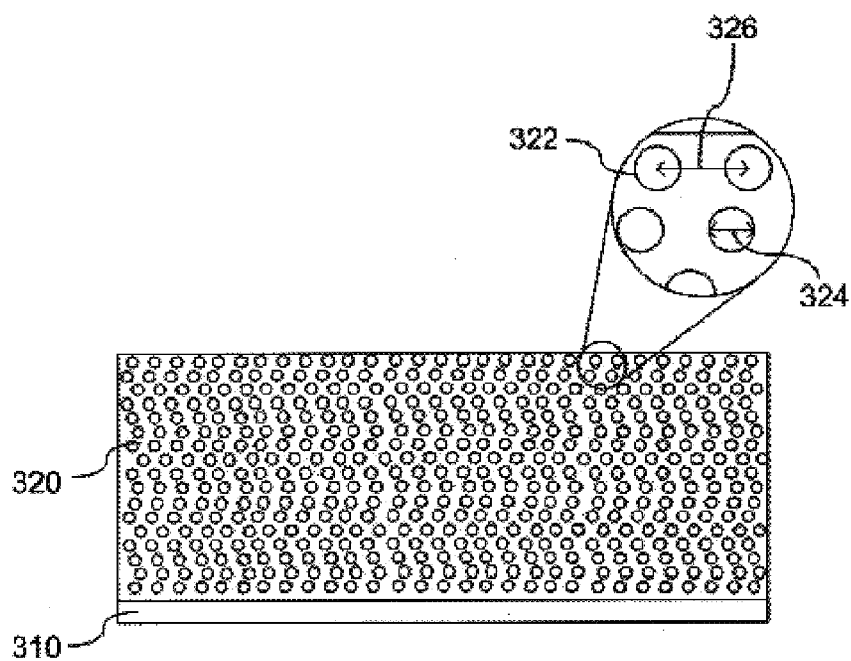
FIG. 3 is an illustration of the cross section of a partially processed substrate showing a dielectric layer formed on top of an etch stop layer, where the dielectric layer has been formed by the process of the present invention.

FIG. 3 shows the porous metal silicate dielectric layer of the present invention 320 formed on top of an etch stop layer 310, such as SiN. The etch stop layer 310 is formed on a substrate (not shown). The substrate is typically a wafer upon which other manufacturing operations have been performed to form various electrical components, including, but not limited to transistors, as well as conductive interconnections.

The pore walls 322 of the metal silicate dielectric layer, which have aluminum or another metal incorporated directly into their structure, are strong enough to allow subsequent processing, such as etching or chemical mechanical polishing, to take place on the dielectric layer without compromising the structural integrity of the dielectric.

The pore size 324 and distance between pores 326, and thus the k-value of the film, are determined by the type and amount of surfactant used in the initial preparation of the metal silicate sol gel 110. Embodiments of the amount and type of surfactant used to form the resulting desired pore size and distance between pores are given in Table 3. The resulting k value for all films is less than 2.0.

TABLE 3

| Surfactant | Amount Used (g) | Structure of Film | Pore Size (nm) | Pore—Pore Distance (nm) |
|---|---|---|---|---|
| L121 EO5PO70EO5 | 6 | Lamellar | 4.1 | 6.8 |
| P65 EO20PO30EO20 | 4 | Lamellar | 3.1 | 6.7 |
| P85 EO26PO39EO26 | 3 | Lamellar | 3.2 | 6.9 |
| P123 EO20PO70EO20 | 3 | Lamellar | 5.9 | 8.0 |

TABLE 3-continued

| Surfactant | Amount Used (g) | Structure of Film | Pore Size (nm) | Pore—Pore Distance (nm) |
|---|---|---|---|---|
| 25R4 EO19PO33EO19 | 2 | Lamellar | 2.2 | 5.5 |
| F127 EO106PO70EO106 | 4 | Lamellar | 6.1 | 9.5 |

Additionally, a mixture of surfactants can be used to control the pore size 324 of the resulting film to within 0.2 nm. Embodiments of the ratios of surfactants used and the resulting pore-pore distance 326 are given in Table 4.

TABLE 4

| Ratio | Amount Used | P123:P85 (pore—pore distance/10 *nm) | P85:P65 (pore—pore distance/10 *nm) | P123:P65 (pore—pore distance/10 *nm) |
|---|---|---|---|---|
| 100:0 | 1 g | 99.98 | 85.47 | 99.98 |
| 80:20 | 1 g | 97.30 | 83.38 | 95.17 |
| 60:40 | 1 g | 94.23 | 81.02 | 89.43 |
| 40:60 | 1 g | 91.35 | 78.91 | 84.41 |
| 20:80 | 1 g | 88.65 | 76.48 | 79.22 |
| 0:100 | 1 g | 85.47 | 74.50 | 74.50 |

Figure 4:
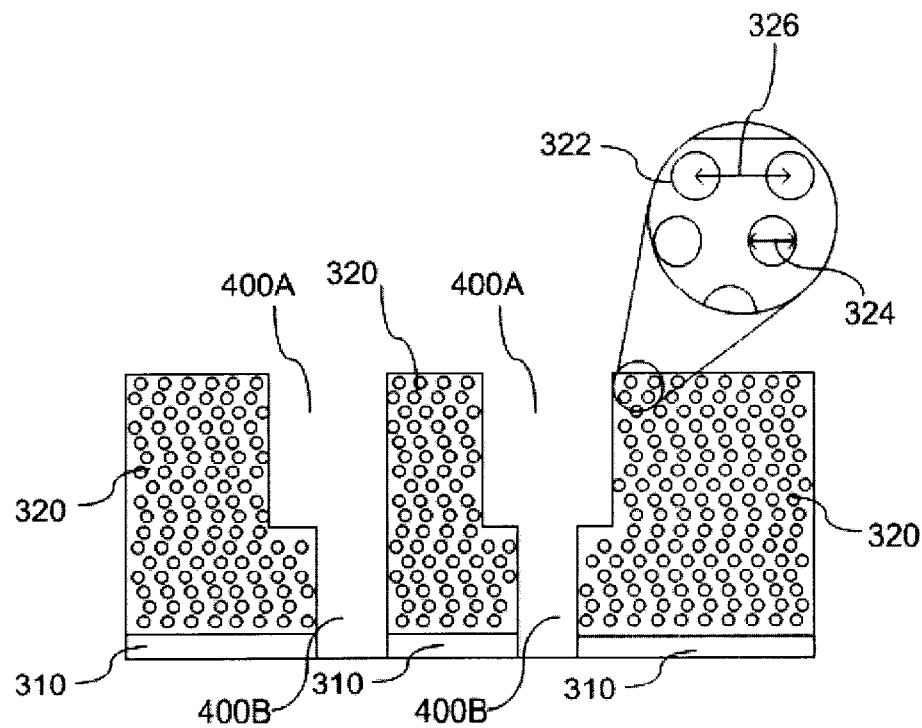
FIG. 4 is an illustration of the cross section of the structure of FIG. 3, after the dielectric layer has been etched to form dual damascene openings.

FIG. 4 shows the structure of FIG. 3 after photolithography and etching operations, which are performed in order to create trench 400A and via 400B openings. As shown in FIG. 4, trench 400A is formed in metal silicate dielectric layer 320, while via opening 400B is formed through both metal silicate dielectric layer 320 and etch stop layer 310.

Figure 5:
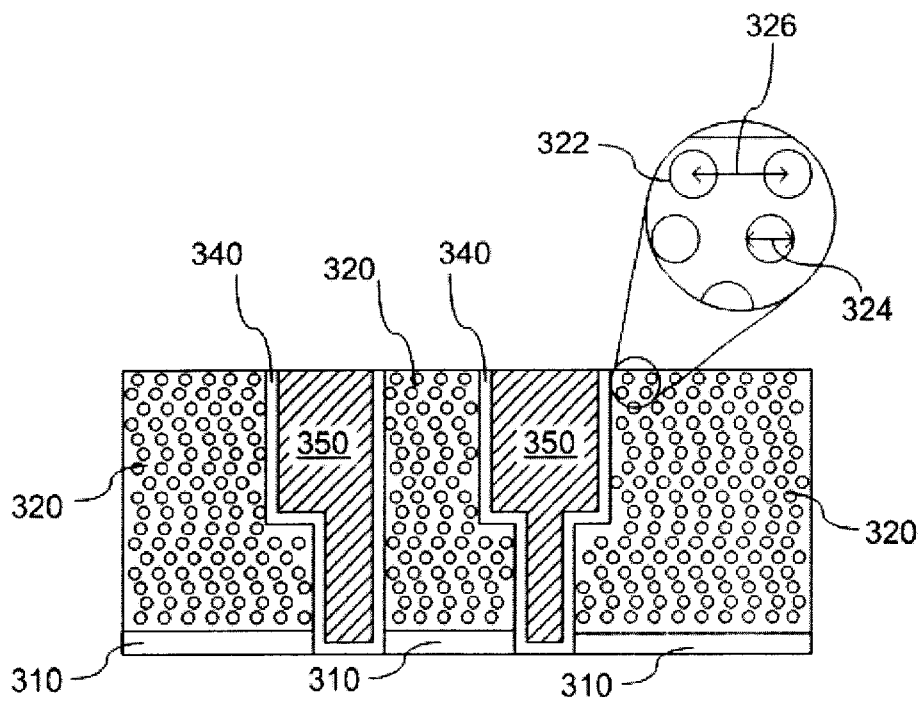
FIG. 5 is an illustration of the cross section of the structure of FIG. 4, after a barrier layer and seed layer have been formed, a copper layer has been deposited, and excess copper has been removed by chemical mechanical polishing.

FIG. 5 shows the structure of FIG. 4, after the processing operations of forming a copper diffusion barrier 340 and copper interconnect lines 350, creating dual damascene interconnect structures. After the dual damascene structures are formed, excess copper and barrier layer material is removed, typically by a chemical mechanical polishing process. Although dual damascene structures are described, damascene or other appropriate interconnect structures may be formed within the metal silicate dielectric layer as well.

Figure 6:
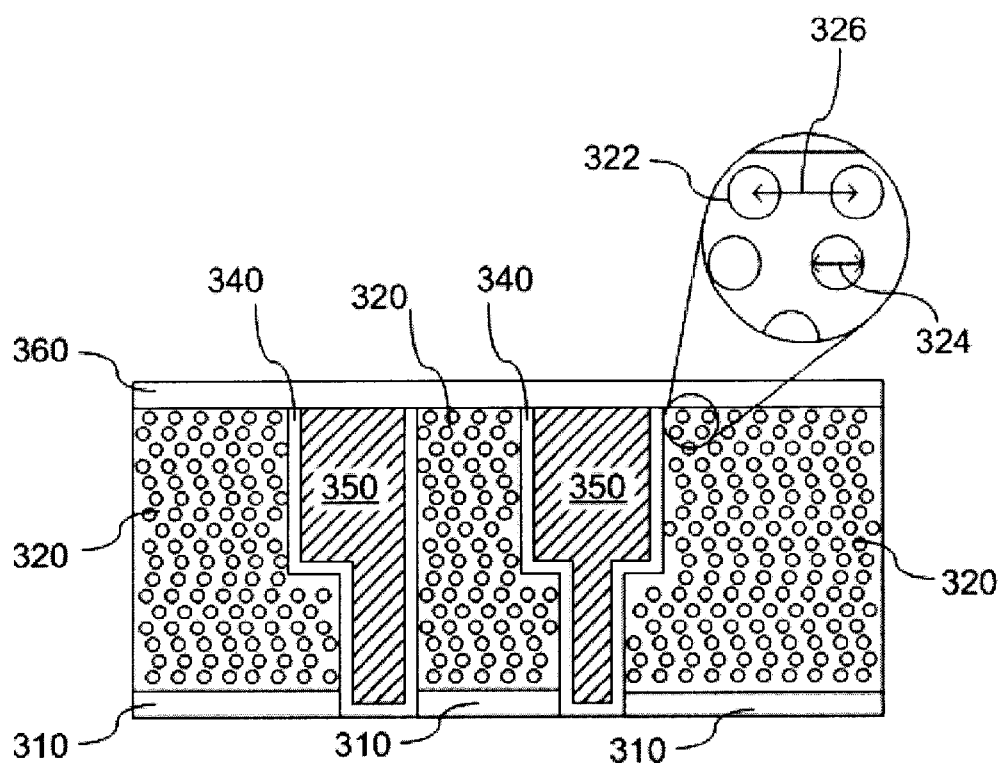
FIG. 6 is an illustration of the cross section of FIG. 5, after a copper diffusion barrier has been deposited over the dielectric layer and the exposed portions of the copper interconnect lines.

FIG. 6 shows the structure of FIG. 5, after an etch stop layer 360 is formed over the polished surface. The barrier is typically formed of a material such as SiN or SiC, which can act as a barrier to the diffusion of copper atoms.

Conclusion

In general, embodiments of the present invention provide a method for forming a porous metal silicate low-k dielectric layer with a k-value of less than 2.0. The porous metal silicate dielectric is suitable for integration into the microelectronic device manufacturing process.

Advantages to some embodiments of the present invention include the ability to control the pore size and structure, allowing control of the pore size to within 0.2 nm and choice of either lamellar, hexagonal, or cubic structure, depending on the type and combination surfactants used. A dielectric film having a k-value of less than 2.0 can be consistently formed by embodiments of the present invention. Additionally, the addition of metal into the pore wall structure gives the film greater mechanical strength than is typical for silicate only films. Films formed by embodiments of the present invention are also more elastic than silicate only films, are resistant to mass transport of die materials through the film, and are resistant to reactions with materials used in the manufacturing process.

The present invention may be implemented with various changes and substitutions to the illustrated embodiments. For example, the present invention may be implemented on substrates comprised of materials other than silicon, such as, gallium arsenide or silicon on insulator (SOI).

Although specific embodiments, including specific equipment, parameters, methods, and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of this invention as expressed in the subjoined Claims.

What is claimed is:

1. A method of forming a metal-silica sol-gel, comprising:
    dissolving a surfactant in an alcohol-type solvent and an acid to form a solution;
    mixing a silicon precursor with the solution;
    after mixing the silicon precursor with the solution, heating the solution such that the silicon precursor is partially hydrolysed; and
    adding a metal alkoxide to the solution.

2. The method of claim 1, wherein the surfactant is selected from the group consisting of triblock copolymers of polyethylene (PEO), polypropylene (PPO), polyalkyloxide materials, triblock neutral surfactants, or polyoxyethylene alkyl ethers.

3. The method of claim 1, wherein the alcohol-type solvent is selected from the group consisting of ethanol, methanol, 1-propanol, 2-propanol, or 1-butanol.

4. The method of claim 1, wherein the acid is selected from the group consisting of hydrochloric (HCl), nitric, sulfuric, phosphoric, hydrofluoric (HF), acetic, and citric acid.

5. The method of claim 1, wherein the silicon precursor is selected from the group consisting of tetraethoxysilane (TEOS), tetramethoxysilane (TMOS), tetrapropoxysilane (TPOS), and tetrabutoxysilane (TBOS).

6. The method of claim 1, wherein the solution is heated to a temperature between 22° C. and 100° C. for up to 2 hours.

7. The method of claim 1, further comprising cooling the solution to a temperature between −4° C. and 22° C. prior to adding the metal alkoxide.

8. The method of claim 1, wherein the metal alkoxide is an alkoxide of boron, lanthanum, yttrium, titanium, or zirconium.

9. The method of claim 1, wherein the metal alkoxide is an alkoxide of aluminum.

10. The method of claim 1, further comprising adding water to the solution after adding the metal alkoxide.

11. The method of claim 10, further comprising filtering the solution with a 0.25 μm filter.

12. The method of claim 11, further comprising depositing the solution onto a substrate.

13. The method of claim 12, further comprising calcining the solution.

14. A method of forming a metal-silica sol-gel, comprising:
    dissolving a surfactant in an alcohol-type solvent and an acid to form a solution;
    mixing a silicon precursor with the solution;
    cooling the solution to a temperature below 22° C.; and
    after cooling the solution, adding a metal alkoxide to the solution.

15. The method of claim 14, wherein the surfactant is selected from the group consisting of triblock copolymers of polyethylene (PEO), polypropylene (PPO), polyalkyloxide materials, triblock neutral surfactants, or polyoxyethylene alkyl ethers.

16. The method of claim 14, wherein the alcohol-type solvent is selected from the group consisting of ethanol, methanol, 1-propanol, 2-propanol, or 1-butanol.

17. The method of claim 14, wherein the acid is a material selected from the group consisting of hydrochloric (HCl), nitric, sulfuric, phosphoric, hydrofluoric (HF), acetic, and citric acid.

18. The method of claim 14, wherein the silicon precursor is selected from the group consisting of tetraethoxysilane (TEOS), tetramethoxysilane (TMOS), tetrapropoxysilane (TPOS), and tetrabutoxysilane (TBOS).

19. The method of claim 14, wherein the solution is cooled to a temperature between −4° C. and 22° C.

20. The method of claim 14, wherein the solution is cooled to a temperature of 0° C.

21. The method of claim 14, further comprising heating the solution after mixing the silicon precursor with the solution, such that the silicon precursor is partially hydrolysed.

22. The method of claim 14, wherein the metal alkoxide is an alkoxide of boron, lanthanum, yttrium, titanium, or zirconium.

23. The method of claim 14, further comprising adding water to the solution after adding the metal alkoxide.

24. The method of claim 23, further comprising filtering the solution with a 0.25 μm filter.

25. The method of claim 24, further comprising depositing the solution onto a substrate.

26. The method of claim 25, further comprising calcining the solution.

27. A method of forming a porous metal-silicate film, comprising:
    preparing a metal silicate sol-gel;
    depositing the sol-gel onto a substrate; and
    calcining the sol-gel, whereby the sol-gel is exposed to ozone.

28. The method of claim 27, whereby calcination takes place in an oven sealed by compression gaskets.

29. The method of claim 27, wherein the ozone has a concentration of 1 μg/mL and is fed through the oven at a rate of 31 mL/min.

30. The method of claim 29, further comprising nitrogen co-fed through the oven at a rate of 31 mL/min with the ozone.

31. The method of claim 28, wherein the oven is heated to a temperature of 400° C.

32. The method of claim 31, further comprising holding the temperature of the oven at 400° C. for 4 hours.

33. The method of claim 32, further comprising cooling the oven to room temperature.

34. A method of forming a porous aluminosilicate dielectric layer, comprising:
    dissolving a surfactant in an alcohol-type solvent and an acid to form a solution;
    mixing a silicon precursor with the solution;
    after mixing the silicon precursor with the solution, heating the solution such that the silicon precursor is partially hydrolysed;
    cooling the solution to 0° C.;
    after cooling the solution, adding aluminum sec butoxide to the solution;
    adding water to the solution;
    depositing the solution onto a substrate; and
    calcining the solution, whereby the solution is exposed to ozone.

35. The method of claim 34, further comprising performing subsequent processing steps on the porous aluminosilicate dielectric layer, thereby forming damascene or dual damascene interconnect structures within the porous aluminosilicate dielectric layer.

\* \* \* \* \*

UNITED STATES PATENT AND TRADEMARK OFFICE
CERTIFICATE OF CORRECTION

PATENT NO. : 6,699,797 B1
DATED : March 2, 2004
INVENTOR(S) : Morris et al.

Page 1 of 1

It is certified that error appears in the above-identified patent and that said Letters Patent is hereby corrected as shown below:

Column 3,
Line 34, delete "(HC1)" and insert -- (HCI) --.

Column 4,
Line 4, delete "1n" and insert -- In --.

Column 9,
Line 10, delete "(HC1)" and insert -- (HCI) --.

Signed and Sealed this

Twenty-second Day of June, 2004

JON W. DUDAS
*Acting Director of the United States Patent and Trademark Office*